United States Patent [19]

Cadot

[11] 4,086,527

[45] Apr. 25, 1978

[54] METHOD AND APPARATUS FOR MONETARY ARTICLES AUTHENTIFICATION

[75] Inventor: Robert G. Cadot, Saint-Peray, France

[73] Assignee: Crouzet, Paris, France

[21] Appl. No.: 669,759

[22] Filed: Mar. 24, 1976

[30] Foreign Application Priority Data

Mar. 25, 1975 France ............................... 75 09572

[51] Int. Cl.$^2$ ............................................. G01R 33/00

[52] U.S. Cl. .................................. 324/233; 324/.5 A; 324/239; 324/227; 250/559; 340/149 R

[58] Field of Search ............... 324/34 R, .5 A, .5 AC, 324/43 R, 41, 34 MC, 34 FL, 34 D, 46, 58.5 A; 194/100, 101

[56] References Cited

U.S. PATENT DOCUMENTS

| | | | |
|---|---|---|---|
| 3,085,195 | 4/1963 | Anderson | 324/.5 A |
| 3,113,263 | 12/1963 | Collins | 324/.5 A |
| 3,155,941 | 11/1964 | Mims | 324/.5 A |
| 3,638,238 | 1/1972 | Milford | 324/41 |
| 3,707,672 | 12/1972 | Miller | 324/41 |
| 3,833,850 | 9/1974 | Weber | 324/41 |
| 3,869,663 | 3/1975 | Tschierse | 324/41 |

*Primary Examiner*—M. Tokar

*Attorney, Agent, or Firm*—Marmaduke A. Hobbs

[57] ABSTRACT

An authentication method for standardized objects, such as in particular monetary articles, in which an object to be authenticated is introduced into the field located between an emitter and a receiver delivering at least an alternative physical quantity, whose quantitative alteration produced by the presence of said object in said field is measured, the result being compared with a reference value pre-stored in a memory and distinctive of the object to authenticate, whereby, within a tolerance approximation, an authentication criterion is deducted, method characterized by the fact that said alteration is measured at different frequencies, that corresponding alterations are successively measured and then simultaneously compared with said respective reference quantities.

5 Claims, 6 Drawing Figures

METHOD AND APPARATUS FOR MONETARY ARTICLES AUTHENTIFICATION

This invention relates to devices for authenticating monetary articles, in particular metallic, of the kind comprising means for electronic control.

It is previously known to utilize electronic devices which involve various kinds of means to control or authenticate pieces of money or banknotes. Some of these devices utilize the deformation of a magnetic field supplied by an a. c. current flowing through a coil; this deformation, produced by the passage of the coin, is followed by a measurable alteration of the amplitude and phase parameters of the signal at the coil terminals. Other devices measure the absorption by a coin or a banknote of the energy of a distinctive electrical signal.

Others still run a differential control between the reference signal of the article to be authenticated and the signal of a standard article.

All these more or less sophisticated devices have, in common, the fact that they need, in order to operate efficiently, a setting adapting the measuring means referring to one or more of the measurable quantities, generally analogical, distinctive of the article to authenticate. This individual setting, usually hard to perform and moreover seldom stable in time, is fixed in the neighbourhood of an optimum point of the scope of measurement of the distinctive quantities of the kind of article in consideration.

This common feature of the different kinds of known devices is not without disadvantages.

In the first place, indeed, and taking into account the number of objects which have to be authenticated and of the relatively small number of authentication criteria which they are capable of appreciating, the probability to see them accept an object geometrically identical but not genuine is far from being negligible.

Yet, it is known that this risk is legally unacceptable in the public cash registers and apparatuses adapted in particular to return the over-payment with specie taken from the cash-box supplied by previous payments. On the other hand, in applications where this risk, although not legally unacceptable, is considered economically intolerable, the acceptance beyond a certain proportion of objects which are not genuine, entails for the operator the necessity of a new setting, leading to reducing the acceptance tolerance of good coins and to increasing the risk to refuse some of them. As a matter of fact, the necessity of a new setting constitutes a palliative which displaces the problem without solving it, since the probability mentioned hereabove of the acceptance of a bad coin, far from being cancelled, remains of the same order.

Furthermore, it is known that the known apparatuses are expensive to adapt to another variety of coins, different to that for which they were foreseen, because in fact it is always necessary to devote an appreciable time to the analysis of the measurable criteria of authentication of the new monetary article in order to determine the optimum setting point of the device in the new scope of measurement.

The invention provides means to avoid such disadvantages and to make the authentication of the monetary article presented to its control almost absolute, such that it can be applied without restrictions to the public cash registers and apparatuses giving back the over-payment and adapted without delay to any variety of kind of money.

To this effect, it is an object of the invention to provide an authentication device for standardized objects, such as in particular monetary articles, in which an object to be authenticated is introduced in the field located between an emitter and a receiver delivering at least an alternative physical quantity, whose quantitative alteration produced by the presence of said object in said field is measured, the result being compared with a reference value pre-stored in a memory and distinctive of the object to authenticate, whereby within a tolerance approximation, an authentication criterion is deducted, method characterised by the fact that said alteration is measured at various frequencies, that corresponding alterations are successively measured and then simultaneously compared with said respective reference quantities.

A further object of the invention is to provide an apparatus for implementing above mentioned process, of the kind comprising an oscillator energizing an emitter, a receiver delivering alternative physical quantities, a quantifying operator arranged to supply quantitative information relative to said quantities, a re-programmable memory and a comparator, characterised by the fact that the oscillator is of the controlled variable frequency type, that the memory is arranged to store the reference quantities relative to various standardized objects, and that it comprises further means arranged for selecting from an initiating signal delivered by the quantifying operator, and, by successive stages, the frequency of the oscillator, and controlling simultaneously the corresponding progression of the memory register.

The invention will be better understood by reading the following description which, reference being made to the accompanying drawings, describes an embodiment of the device particularly adapted, according to the proposed method, for the authentication of standardized metallic objects such as pieces of money.

In this embodiment, the solution was considered to measure for various frequencies the alterations of an alternative magnetic field owing to the quantitative manifestations produced by such alterations on the phase and amplitude of the voltage collected at the terminals of the secondary coil of a transformer whose magnetic circuit is formed to lodge therein the metallic object (coin, token, etc.) for control in such manner that it is entirely immersed in the magnetic field in order to avoid aberrations of positionning.

BRIEF DESCRIPTION OF THE DRAWINGS

FIG. 1 shows three different embodiments of a measuring transformer of the invention.

In these examples of embodiment, the choice was made of the coupling of two distinct coils whose coefficient of mutual induction is affected by the introduction of a metallic object. It is natural to consider further equivalent electromagnetic means and, in the case of non metallic objects such as for instance banknotes, photoelectric couplers or also capacitive detectors, without for all that going out of the scope of this invention.

Figure 1A:
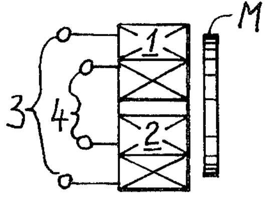
FIGS. 1*a*, 1*b*, 1*c* illustrate schematically by way of example three different embodiments of a measuring transformer T1 in which a coin M is lodged within the magnetic circuit common to the primary coil 1 and the secondary coil 2, respectively provided with input terminals 3 for the supply of alternative current and output terminals 4 for collecting the signal whose features are modified by the presence of coin M.
Figure 1B:
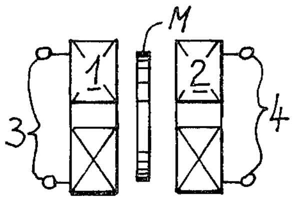
Figure 1C:
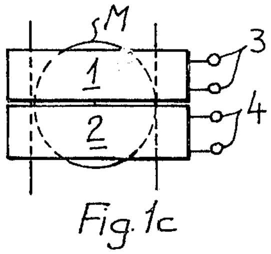
Figure 2:
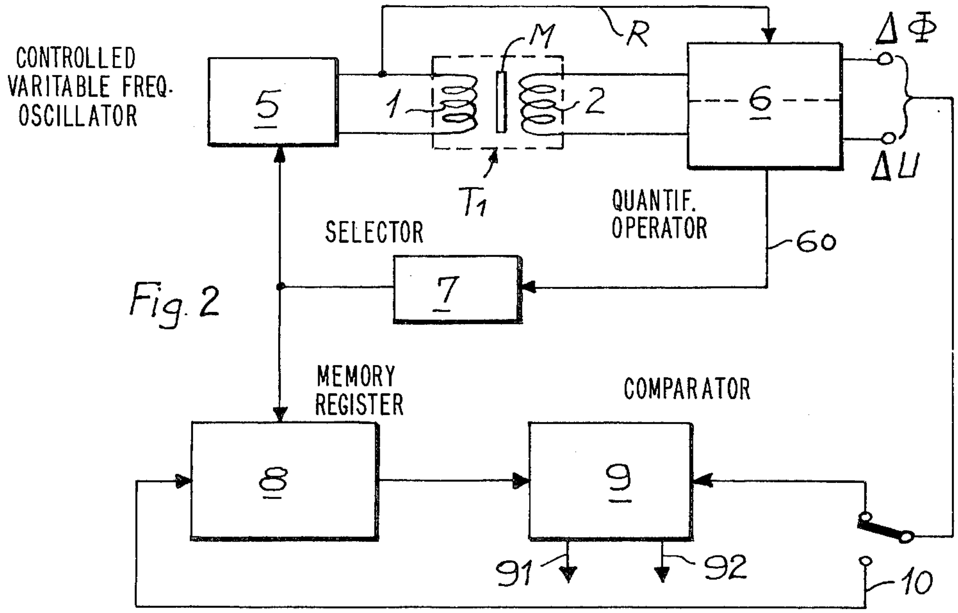
FIG. 2 shows the preferred embodiment of system elements of the invention.

In the preferred embodiment, such as represented on the chart of FIG. 2, the primary coil 1 of a transformer is energized by a sinusoidal voltage whose frequency is adjustable to various fixed values. This voltage is supplied automatically by a controlled variable frequency oscillator 5 (CVFO) whose make-up is well known in the art. The secondary coil 2 is connected to associated organs in the quantifying operator 6 which allows to obtain the quantitative information regarding, on the one hand, the amplitude of the secondary signal and, on the other hand, its phase in relation to that of the primary signal owing to link of reference 7.

Under these conditions, if a coin M is put in the field of the transformer T1, it is seen that for each value of the frequency of the energizing signal supplied by the CVFO 5 correspond particular values of the phase and signal voltage collected at the output of quantifying operator 6. The known devices gathered in the latter can supply values in the analogical or the numerical forms. Nevertheless, in order to permit in particular the use of commercially available integrated electronic circuits in memory matters, the numerical technics were preferred. The quantities collected at the output of quantifying operator 6 can be easily introduced into re-programmable memories permitting the adaptation of the device for authentication of such or such variety of coin.

Figure 3:
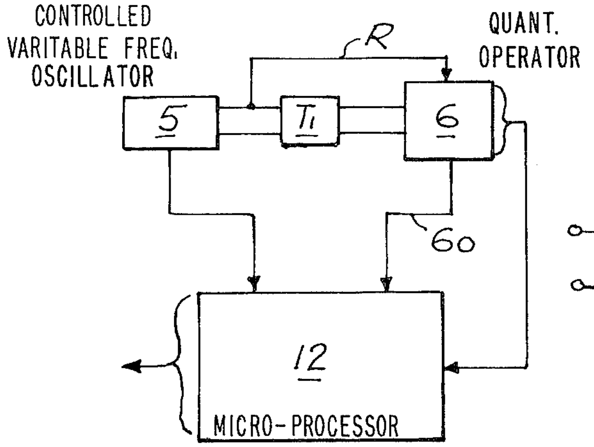
FIG. 3 shows the micro-processor associated with the invention.

The whole unit of the authenticating device represented in FIG. 3 comprises also a selector 7 whose function is, on the one hand, to select a frequency within the range of the CVFO 5 and, on the other hand, to select amongst the stored values those which correspond normally to the selected frequency.

Selector 7, which is built in a known way, operates by successive stages from an initiating signal issued by quantifying operator and carried out by link 60, according to the procedure explained later, to the simultaneous control of CVFO 5 and memory register 8 in which is accumulated the whole of the numerical quantity groups respectively corresponding to each frequency of the range of CVFO 5.

The function of memory 8 is of course to gather the distinctive numerical quantities of various varieties of coins which are proposed for authentication.

As will be seen later, memory 8 is loaded with information during the "learning" operation, and its capacity in number of lines of information is proportional:

to the number of stages of selector 7, to the number of varieties of coins to authenticate, to the number of distinctive quantities retained for each variety of coin.

All this can be evaluated in the proposed embodiment respectively in the following manner:

10 stages of selection corresponding to the following frequency range available at the output of CVFO 5: 25, 5, 10, 20, 40, 60, 90, 135, 200 and 300 KHz;

6 varieties of coins corresponding to the different following monetary values: 0,1 - 0,2 - 0,5 - 1 - 5 - 10 FF;

2 distinctive quantities corresponding to the amplitude and phase variation of the signal available at the output of quantifying operator 6, in numerical form of 8 digits each. This digitizing operation requires a minimum storage capacity of $10 \times 6 \times 2 = 120$ words of 8 digits, experience having proven that it was sufficient without nevertheless being considered as restrictive.

The device according to FIG. 2 comprises finally a comparator 9 of known make-up, operating, for each stage determined by selector 7, the logic comparison of the new numerical quantities available at the output of operator 6 with those stored in memory 8. The result of the comparison at the end of the scanning of the frequency range permits to know, owing to the logic information available at the output terminals 91 and 92 of comparator 9:

the non conformity of the characteristics of the object presented with either of the stored characteristics, which entails its rejection, the conformity of the characteristics of the coin presented or controlled with those corresponding to each variety of coins approved which are stored in the memory, which entails its acceptance, the variety of coins presented.

Considering the whole unit of FIG. 2, it can be understood that it is very easy to "teach" the device the distinctive quantities of the different varieties of coins to authenticate.

To this effect, owing to the temporary link 10, the terminals of operator 6 are connected to the storing input terminals of memory 8. Model M of the variety of coin to authenticate is then put in the field of transformer T1 and the scanning of CVFO 5 is started by selector 7.

At each scanning stage, the distinctive numerical quantities of the new coin are stored in memory 8.

As already said, the whole of the means, to be put in operation in the device hereabove described, belong to well known technological fields, yet the recent evolution in the field of micro-electronics induces to rather use a large scale integrated micro-processor. This solution offers actually the advantage of having a logic unit powerful enough to realise, on the other hand, the servo-control of all the various functions of the cash system in which it is proposed to use the authenticating device, these different functions consisting in particular in:

the management of reserves for re-cycling money, the calculation of the amounts payed out, the display of the data of the transaction, the book-keeping the edition of the operating account, the supervision of all the operations and the release of the alarms, etc.

By using the authenticating device from this point of view, there follows that the cost of the product is relatively low, this constituting a remarkable progress.

The functions of a complete cash system, apart from those concerning the authentication as such, necessitate in all cases a very elaborate technological structure. The fact that a micro-processor is used at this stage permits to integrate the identification function whose incidence on the global cost price of the system is moderate, due to the programming simplicity of the field reserved to the authenticating device as such.

The non integrated parts of the latter are limited to an CVFO, a measuring transformer and an analogical or digital quantifying means for the distinctive quantities produced at the secondary of a transformer.

Since the whole of the device is endowed with the faculty of learning, the various non integrated parts of the device have not to be realised in a precise and repetitive way in their precision. The reason is that the absolute values of the quantities supplied and stored during the learning operation are without importance at the only condition that the temperature and time stability of the CVFO and the quantifying operator circuits be ensured, which, in the actual state of the technics, does not bring any difficulties.

The chart diagram of FIG. 3 illustrates the structure of the device according to the invention, associated with micro-processor 12. Link 60 between the latter and quantifying operator 6, established to permit to inititate the authenticating process when a coin is introduced in the magnetic field of transformer T1, should be remarked.

In operation, CVFO 5 supplies an alternative voltage to primary 1 of transformer T1 and this voltage is recovered, excepting the transformation ratio, at the secondary 2. When a coin penetrates into the field, the voltage associated with secondary 2 is perturbed in the form of a signal fitted to initiate the process. Under these conditions, the whole unit CVFO - transformer - quantifying operator when in operation, behaves as a proximity detector.

Figure 4:
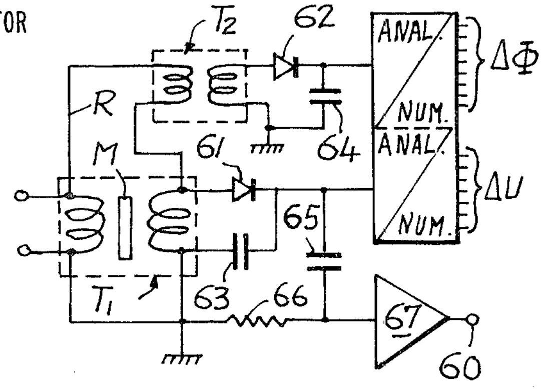
FIG. 4 shows the phase and amplitude quantifying operator of the invention.

FIG. 4 illustrates an embodiment of a quantifying operator for the phase and amplitude variations of the signal provided by transformer T1 during a control operation. As was already considered hereabove, the quantifying operator is provided with a device permitting to deliver to selector 7, or to the organ which is in its place in the micro-processor 12, an initiating signal.

Transformer T1, which has already been discussed hereabove, is coiled in such manner that, in the absence of a coin in its magnetic circuit, no current flows to the primary of another transformer T2 whose primary coil supplies, owing to link R, a secondary coil of T1 with a voltage proportional to the phase spacing between the primary and the secondary coils of T1. As soon as a coin M is introduced into the field of T1, the phase rotation produced in the secondary coil of T1 produces an a.c. current in the primary coil of T2 and thereupon, at the terminals of the secondary coil of the latter, an alternative voltage proportional to the phase spacing.

The alternative voltages at the terminals of the secondary coils of T1 and T2 are rectified respectively by diodes 61 and 62 and filtered by condensers 63 and 64. The sudden variation of voltage at the terminals of the secondary coil of T1, induced by the introduction of coin M into the magnetic circuit of T1, is differentiated by condenser 61 and resistance 66. Conveniently put back in form, owing to amplifier 67, it is available at the output of the latter to initiate, through link 60, the authentication process.

What I claim is:

1. An authentication method for standardized objects, such as in particular monetary articles, in which an object to be authenticated is introduced into the field located between an emitter and a receiver delivering at least an alternative physical quantity, whose quantitative alteration produced by the presence of said object in said field is measured, the result being compared with a reference value pre-stored in a memory and distinctive of the object to authenticate, whereby, within a tolerance approximation, an authentication criterion is deducted, method characterised by the fact that said alteration is measured at different frequencies, that corresponding alterations are successively measured and then simultaneously compared with said respective reference quantities.

2. An authenticating apparatus for standardized objects such as in particular monetary articles, comprising an oscillator energizing an emitter, a receiver delivering alternative physical quantities, a quantifying operator arranged to supply quantitative information relative to said quantities, a re-programmable memory and a comparator, characterized by the fact that the oscillator is of the controlled variable frequency type, that the memory is arranged to store the reference quantities relative to various standardized objects, and that it comprises further means arranged for selecting, from an initiating signal delivered by the quantifying operator, and by successive stages, the frequency of the oscillator and controlling simultaneously the corresponding progression of the memory register.

3. An apparatus according to claim 2, wherein said emitter and receiver are respectively the primary coil and the secondary coil of a transformer.

4. An apparatus according to claim 2, wherein said means, the memory and the comparator are integrated in a processing unit of a micro-processor type.

5. An apparatus according to claim 3, wherein said means, the memory and the comparator are integrated in a processing unit of a micro-processor type.

* * * * *